(12) United States Patent
Lin et al.

(10) Patent No.: US 12,209,664 B2
(45) Date of Patent: Jan. 28, 2025

(54) ELECTRICALLY AND THERMALLY CONDUCTIVE GASKETS

(71) Applicant: Laird Technologies (Shenzhen) Ltd., Shenzhen (CN)

(72) Inventors: Yi-Shen Lin, Taiwan (TW); Min-Wei Hsu, Taiwan (TW); Tsang-I Tsai, Xinbei (TW)

(73) Assignee: Laird Technologies (Shenzhen) Ltd., Shenzhen (CN)

( * ) Notice: Subject to any disclaimer, the term of this patent is extended or adjusted under 35 U.S.C. 154(b) by 0 days.

(21) Appl. No.: 17/534,009

(22) Filed: Nov. 23, 2021

(65) Prior Publication Data

US 2022/0186835 A1   Jun. 16, 2022

(30) Foreign Application Priority Data

Dec. 10, 2020   (CN) .......................... 202011434499.9
Dec. 10, 2020   (CN) .......................... 202022939691.5

(51) Int. Cl.
*F16J 15/10*   (2006.01)
*F16J 15/02*   (2006.01)
*F16J 15/12*   (2006.01)

(52) U.S. Cl.
CPC ........... *F16J 15/102* (2013.01); *F16J 15/022* (2013.01); *F16J 15/104* (2013.01); *F16J 15/128* (2013.01)

(58) Field of Classification Search
CPC ........ F16J 15/128; F16J 15/104; F16J 15/022; F16J 15/102
See application file for complete search history.

(56) References Cited

U.S. PATENT DOCUMENTS

| 2,116,000 | A | * | 5/1938 | Peterson | ................ | F16J 15/104 |
| | | | | | | 428/491 |
| 3,648,965 | A | * | 3/1972 | Daddona | ................ | F16J 15/104 |
| | | | | | | 249/82 |
| 3,729,205 | A | * | 4/1973 | Kwok | .................... | F16J 15/104 |
| | | | | | | 428/156 |

(Continued)

FOREIGN PATENT DOCUMENTS

CN   103797903 A   5/2014
CN   105667041 A   6/2016
(Continued)

OTHER PUBLICATIONS

Tgon™ M 9000 High Thermal Conductive Graphite Sheet Preliminary; www.lairdtech.com/thermal; Copyright 2014; 2 pages.

(Continued)

*Primary Examiner* — Eugene G Byrd
(74) *Attorney, Agent, or Firm* — Harness, Dickey & Pierce, P.L.C.; Anthony G. Fussner

(57) ABSTRACT

An electrically and thermally conductive gasket includes a resilient core including a plurality of sides, a heat spreader disposed along at least two sides of the plurality of sides of the resilient core, and an electrically conductive layer disposed along and/or covering at least a portion of the heat spreader, such that the portion of the heat spreader is between the resilient core and the electrically conductive layer. The gasket is positionable and/or compressible between first and second surfaces to thereby define an electrically conductive path and a thermally conductive path between the first and second surfaces.

22 Claims, 10 Drawing Sheets

(56) References Cited

U.S. PATENT DOCUMENTS

| | | | |
|---|---|---|---|
| 4,563,375 A | 1/1986 | Ulrich | |
| 4,857,668 A * | 8/1989 | Buonanno | H05K 9/0015 174/356 |
| 5,028,739 A * | 7/1991 | Keyser | H05K 9/0015 29/592.1 |
| 5,045,635 A * | 9/1991 | Kaplo | H02B 1/16 219/738 |
| 5,902,956 A | 5/1999 | Spies et al. | |
| 6,075,205 A | 6/2000 | Zhang | |
| 6,097,598 A | 8/2000 | Miyahara et al. | |
| 6,241,005 B1 | 6/2001 | Risca | |
| 6,309,742 B1 | 10/2001 | Clupper et al. | |
| 6,410,137 B1 | 6/2002 | Bunyan | |
| 6,477,061 B1 | 11/2002 | Johnson | |
| 6,482,520 B1 | 11/2002 | Tzeng | |
| 6,521,348 B2 | 2/2003 | Bunyan et al. | |
| 6,777,086 B2 | 8/2004 | Norley et al. | |
| 6,784,363 B2 | 8/2004 | Jones | |
| 6,835,453 B2 | 12/2004 | Greenwood et al. | |
| 7,161,809 B2 | 1/2007 | Ford et al. | |
| 7,166,912 B2 | 1/2007 | Tzeng et al. | |
| 7,292,441 B2 | 11/2007 | Smalc et al. | |
| 7,303,820 B2 | 12/2007 | Capp et al. | |
| 7,306,847 B2 | 12/2007 | Capp et al. | |
| 7,375,291 B2 | 5/2008 | Ariel | |
| 7,473,855 B2 | 1/2009 | Rutherford et al. | |
| 7,494,712 B2 | 2/2009 | Norley et al. | |
| 7,763,810 B2 | 7/2010 | van Haaster | |
| 7,889,502 B1 | 2/2011 | Reis et al. | |
| 8,217,512 B1 | 7/2012 | Carlson et al. | |
| 8,223,986 B2 | 7/2012 | Sander et al. | |
| 9,067,287 B2 | 6/2015 | Ofoma et al. | |
| 9,226,433 B2 * | 12/2015 | Cook | B32B 5/245 |
| 9,335,104 B2 | 5/2016 | Oh et al. | |
| 9,389,029 B2 | 7/2016 | Chowdhury et al. | |
| 9,445,528 B2 | 9/2016 | Cohen et al. | |
| 10,046,536 B2 | 8/2018 | Jang | |
| 10,104,809 B2 | 10/2018 | Ofoma et al. | |
| 10,881,022 B2 * | 12/2020 | Edwards | H05K 7/2089 |
| 10,965,333 B2 * | 3/2021 | English | H01R 13/2457 |
| 2003/0128519 A1 * | 7/2003 | Justo | H01L 23/3737 428/343 |
| 2004/0032710 A1 | 2/2004 | Fujiwara et al. | |
| 2005/0061474 A1 | 3/2005 | Gelorme et al. | |
| 2006/0180348 A1 | 8/2006 | Cloutier et al. | |
| 2006/0225874 A1 | 10/2006 | Shives et al. | |
| 2006/0272855 A1 | 12/2006 | Rutherford et al. | |
| 2007/0052125 A1 | 3/2007 | Kalinoski et al. | |
| 2008/0157916 A1 | 7/2008 | Mas | |
| 2010/0142154 A1 | 6/2010 | Collet et al. | |
| 2012/0033384 A1 | 2/2012 | Pillai | |
| 2012/0063103 A1 | 3/2012 | Kirk | |
| 2013/0047435 A1 | 2/2013 | Ofoma et al. | |
| 2013/0048262 A1 | 2/2013 | Ofoma et al. | |
| 2014/0203069 A1 * | 7/2014 | Wang | B23K 1/0016 428/317.1 |
| 2014/0332193 A1 | 11/2014 | Oh et al. | |
| 2015/0090486 A1 * | 4/2015 | Cook | B32B 1/08 156/60 |
| 2015/0118482 A1 | 4/2015 | Kagawa | |
| 2015/0301568 A1 | 10/2015 | Hill et al. | |
| 2016/0033043 A1 * | 2/2016 | Busby | B64C 1/36 264/273 |
| 2016/0262291 A1 * | 9/2016 | Tucker | H05K 9/0015 |
| 2017/0150651 A1 | 5/2017 | Hartman et al. | |
| 2018/0034492 A1 * | 2/2018 | Edgren | G02B 6/4269 |
| 2018/0035529 A1 | 2/2018 | Arai et al. | |
| 2018/0177074 A1 | 6/2018 | Wu | |
| 2018/0199460 A1 | 7/2018 | Wu | |
| 2018/0366795 A1 | 12/2018 | Chi et al. | |
| 2019/0014691 A1 | 1/2019 | Ofoma et al. | |
| 2019/0040954 A1 | 2/2019 | Wei et al. | |

FOREIGN PATENT DOCUMENTS

| | | |
|---|---|---|
| CN | 106753018 A | 5/2017 |
| CN | 107105604 A | 8/2017 |
| CN | 206562400 | 10/2017 |
| CN | 111836608 A | 10/2020 |
| EP | 1680274 A2 | 7/2006 |
| EP | 1779713 A2 | 5/2007 |
| EP | 1875790 A2 | 1/2008 |
| GB | 2545212 A | 6/2017 |
| JP | 62-170332 | 7/1987 |
| JP | 2007184392 A | 7/2007 |
| JP | 2010-514916 A | 5/2010 |
| JP | 2014-99558 A | 5/2014 |
| KR | 20090028283 A | 3/2009 |
| KR | 100953679 B1 | 4/2010 |
| KR | 20120083926 A | 7/2012 |
| KR | 101243647 B1 | 3/2013 |
| KR | 101245164 B1 | 3/2013 |
| KR | 101256397 B1 | 4/2013 |
| KR | 102079031 B1 | 2/2020 |
| WO | WO-2001010182 A2 | 2/2001 |
| WO | WO-2001024596 A1 | 4/2001 |
| WO | WO-20130048262 A1 | 4/2013 |
| WO | WO-2014/022125 A1 | 2/2014 |
| WO | WO-2018149512 A1 | 8/2018 |

OTHER PUBLICATIONS

U.S. Appl. No. 17/001,815, filed Aug. 25, 2020, Jason L. Strader, et al.

Extended European Search Report for EP21212733.6 which claims priority to the instant application; dated May 16, 2022; 12 pages.

Japanese Office Action for JP2021-199602 which claims priority to the instant application; Nov. 15, 2022; 5 pages.

* cited by examiner

ELECTRICALLY AND THERMALLY CONDUCTIVE GASKETS

CROSS-REFERENCE TO RELATED APPLICATIONS

This application claims priority to and the benefit of Chinese Invention Patent Application 202011434499.9 filed Dec. 10, 2020 and Chinese Utility Model Application 202022939691.5 filed Dec. 10, 2020 (which registered on Aug. 20, 2021 as ZL202022939691.5). The entire disclosures of the above applications are incorporated herein by reference.

FIELD

The present disclosure relates to electrically and thermally conductive gaskets.

BACKGROUND

This section provides background information related to the present disclosure which is not necessarily prior art.

Electronic devices commonly include one or more gaskets positioned between components. The gaskets may include a foam core with an electrically-conductive fabric wrapped around the foam core.

SUMMARY

This section provides a general summary of the disclosure, and is not a comprehensive disclosure of its full scope or all of its features.

An electrically and thermally conductive gasket includes a resilient core including a plurality of sides, a heat spreader disposed along at least two sides of the plurality of sides of the resilient core, and an electrically conductive layer disposed along and/or covering at least a portion of the heat spreader, such that the portion of the heat spreader is between the resilient core and the electrically conductive layer. The gasket is positionable and/or compressible between first and second surfaces to thereby define an electrically conductive path and a thermally conductive path between the first and second surfaces.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 4:
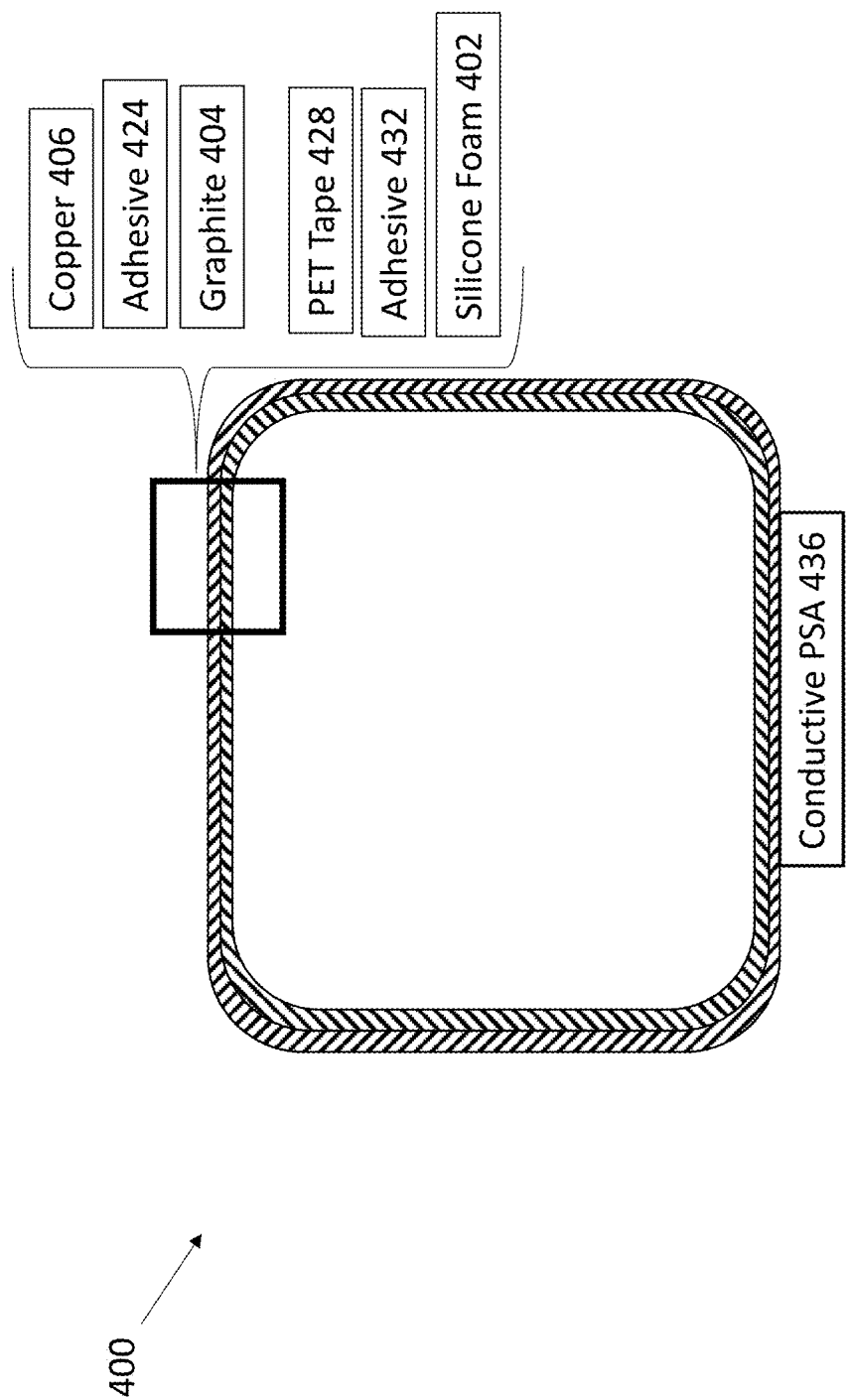
FIG. 4 is a front view of an electrically and thermally conductive gasket according to an exemplary embodiment.
Figure 10:
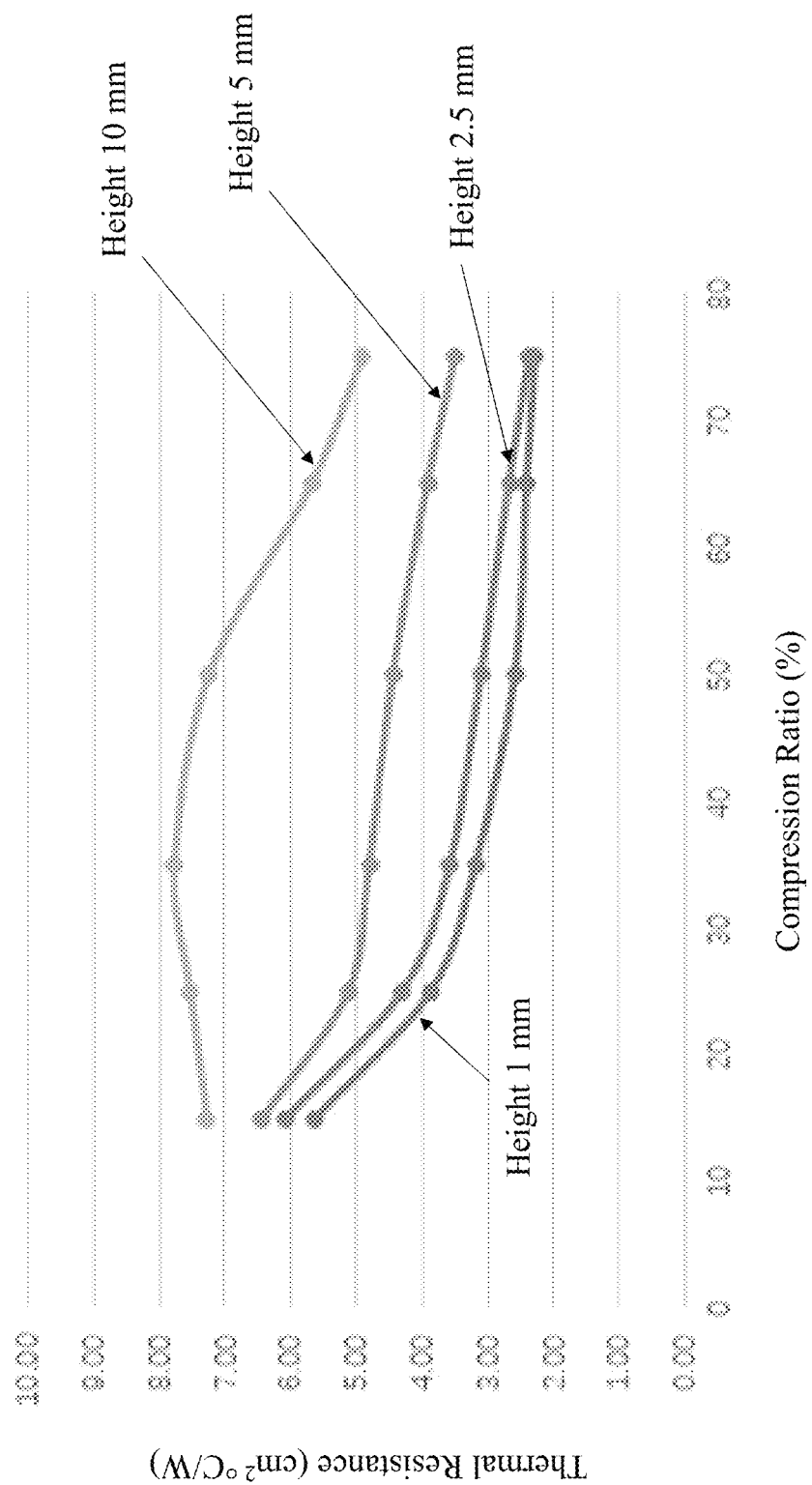

FIG. 10 is a line graph of thermal resistance ($cm^{2\circ}$ C./W) versus gasket height in millimeters (mm) versus compression ratio (%) for a gasket width of 5 mm, gasket length of 25 mm, and gasket heights of 1 mm, 2.5 mm, 5 mm, and 10 mm for an electrically and thermally conductive gasket according to the exemplary embodiment shown in FIG. 4 without conductive PSA along the bottom of the gasket.

Figure 11:
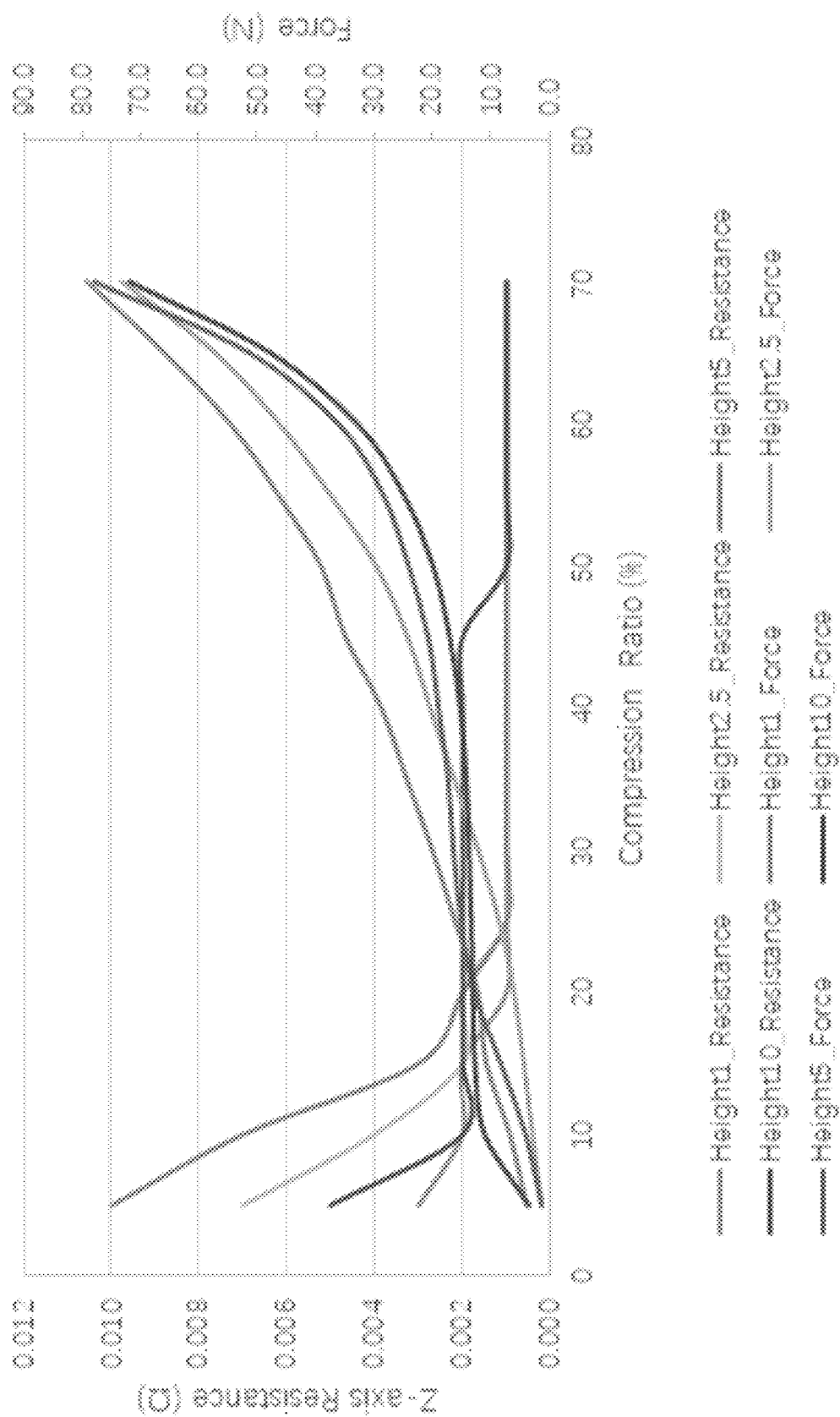

FIG. 11 is a line graph of Z-axis electrical resistance in ohms ($\Omega$) and force om Newtons (N) versus compression ratio (%) for a gasket width of 5 mm, gasket length of 25 mm, and gasket heights of 1 mm, 2.5 mm, 5 mm, and 10 mm for an electrically and thermally conductive gasket according to the exemplary embodiment shown in FIG. 4 without conductive PSA along the bottom of the gasket.

Corresponding reference numerals may indicate corresponding (but not necessarily identical) parts throughout the several views of the drawings.

DETAILED DESCRIPTION

Exemplary embodiments will now be described more fully with reference to the accompanying drawings.

As recognized herein, conventional electrically conductive foams and fabric-over-foam (FOF) gaskets tend to have relatively poor thermal transfer performance. In many cases, however, it is desirable for gaskets positioned between surfaces of device components to exhibit good thermal conductivity and electrical conductivity characteristics while being compressible and resilient. As recognized herein, these characteristics may be achieved by placing (e.g., wrapping, etc.) a heat spreader along portions (or all)

of a gasket's resilient core and placing (e.g., wrapping, etc.) an electrically conductive layer or material along portions (or all) of the heat spreader.

For example, the heat spreader (e.g., graphite, etc.) may exhibit excellent in-plane thermal conductivity (e.g., in the X-Y direction). This allows heat to move through the heat spreader from one side of the gasket to another side of the gasket. And, the electrically conductive layer (e.g., copper, etc.) may be configured to provide mechanical strength, abrasion resistance, and/or protection of the heat spreader. In addition, the electrically conductive layer also provides electrical conductivity and additional thermal transfer, which is far superior to insulative polyethylene terephthalate (PET) films that have been conventionally used to protect graphite.

In exemplary embodiments, an electrically and thermally conductive gasket incudes a copper layer (e.g., copper foil, etc.) wrapped around the outside or perimeter of a graphite over foam gasket. The copper layer may provide mechanical strength, abrasion resistance, and/or protection of the graphite (e.g., inhibit graphite from flaking or breaking off, etc.). The copper layer also provides electrical conductivity, and additional thermal transfer.

By using copper instead of an insulative PET film to cover and/or protect the graphite, the gasket may have both good electrical conductivity for EMI shielding purposes similar to fabric-over-foam gasket (FOF) and high thermal conductivity in a single product, e.g., copper-over-graphite-over-foam (COGOF) electrically and thermally conductive gasket, etc. Accordingly, an exemplary embodiment of an electrically and thermally conductive gasket disclosed herein may be used as a single product that replaces and eliminates the need to use two separate products, i.e., (1) a thermal interface material (TIM), and (2) a fabric-over-foam (FOF) gasket. The exemplary electrically and thermally conductive gaskets disclosed herein may be used for both electrical grounding for EMI shielding and thermal transfer, e.g., within relatively large gaps between surfaces of components in devices, etc. This, in turn, may allow for simpler system setups with the combined heat and electrical paths provided by the gaskets disclosed herein, such as in smaller devices in which space is limited and there is insufficient room for separately providing electrical grounding via a FOF gasket and thermal transfer via a TIM.

Figure 5:
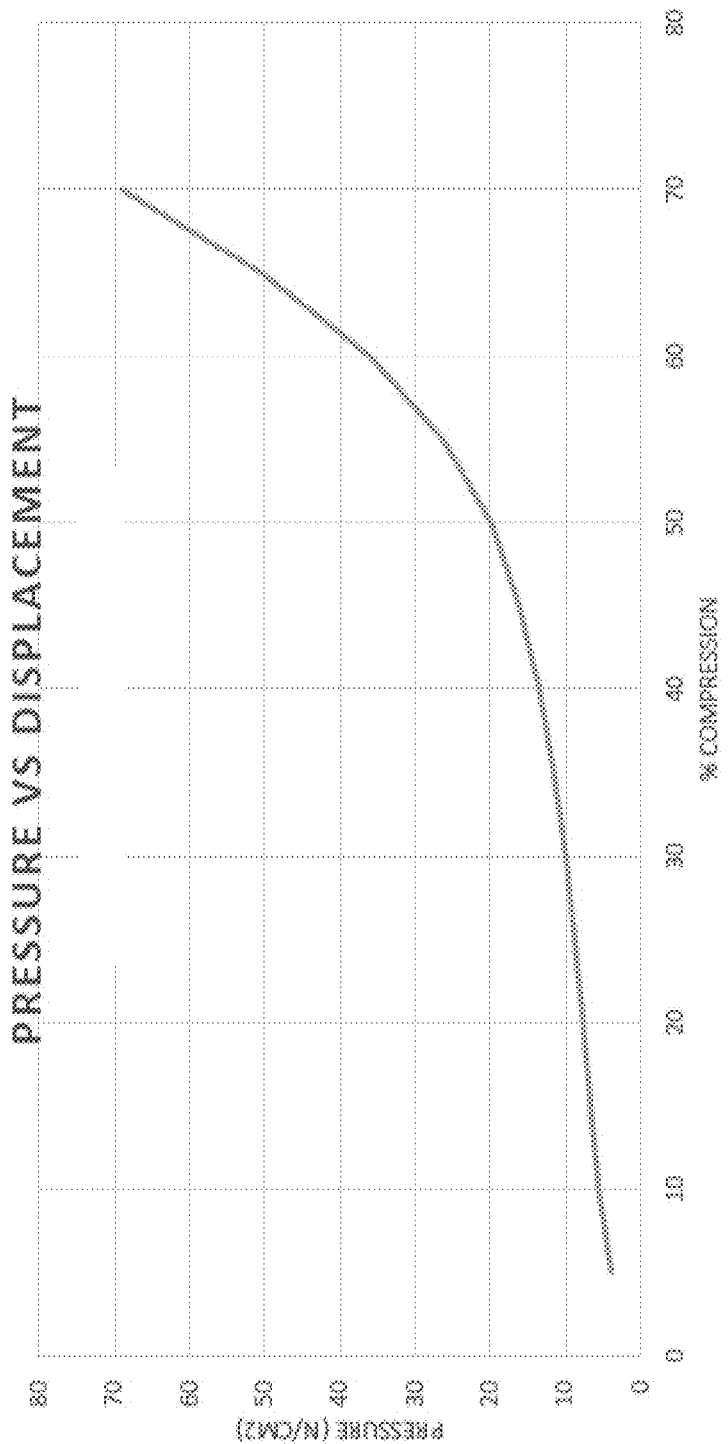
FIG. 5 is a line graph of pressure in Newtons per square centimeter ($N/cm^2$) versus displacement in percent (%) compression ratio for an electrically and thermally conductive gasket according to the exemplary embodiment shown in FIG. 4 without conductive PSA along the bottom of the gasket.
Figure 6:
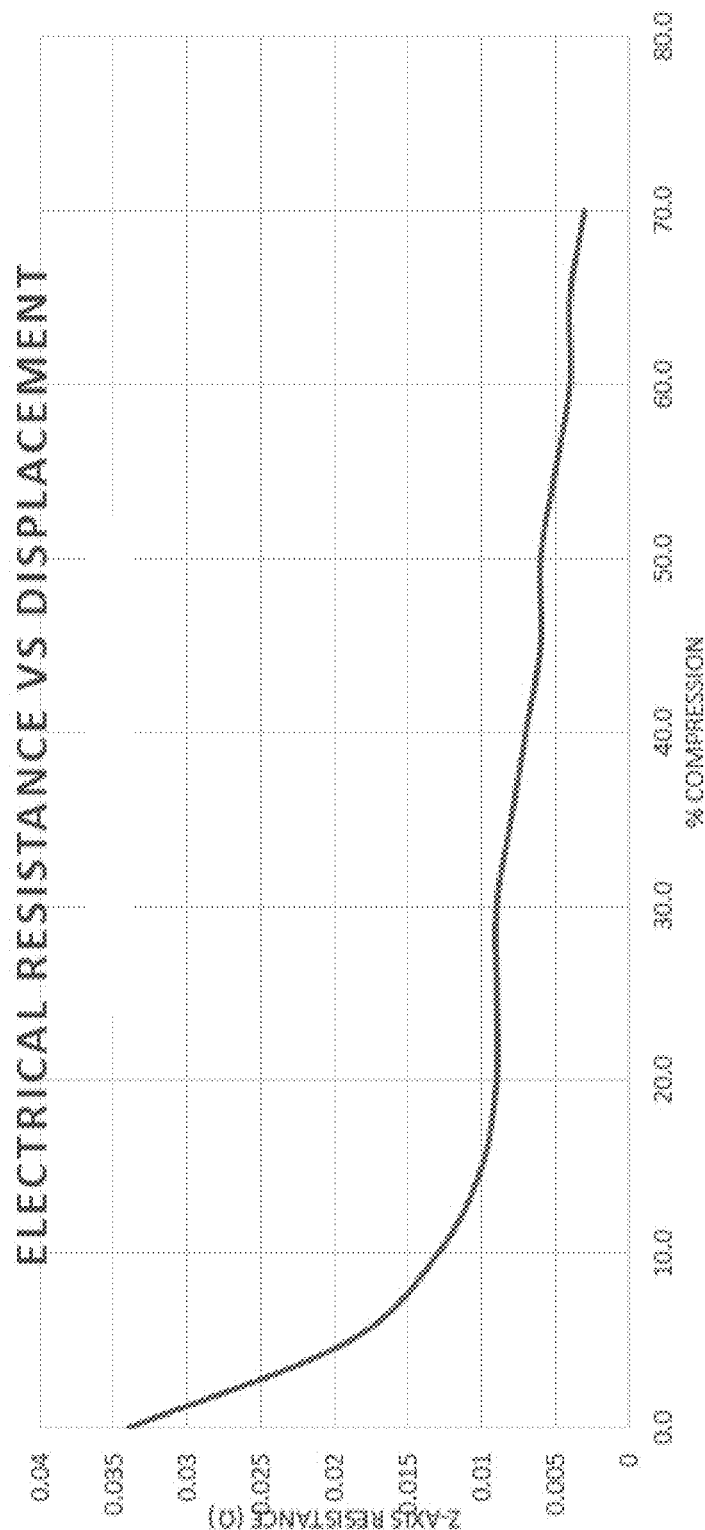
FIG. 6 is a line graph of Z-axis electrical resistance in ohms ($\Omega$) versus displacement in percent (%) compression ratio for an electrically and thermally conductive gasket according to the exemplary embodiment shown in FIG. 4 without conductive PSA along the bottom of the gasket.
Figure 7:
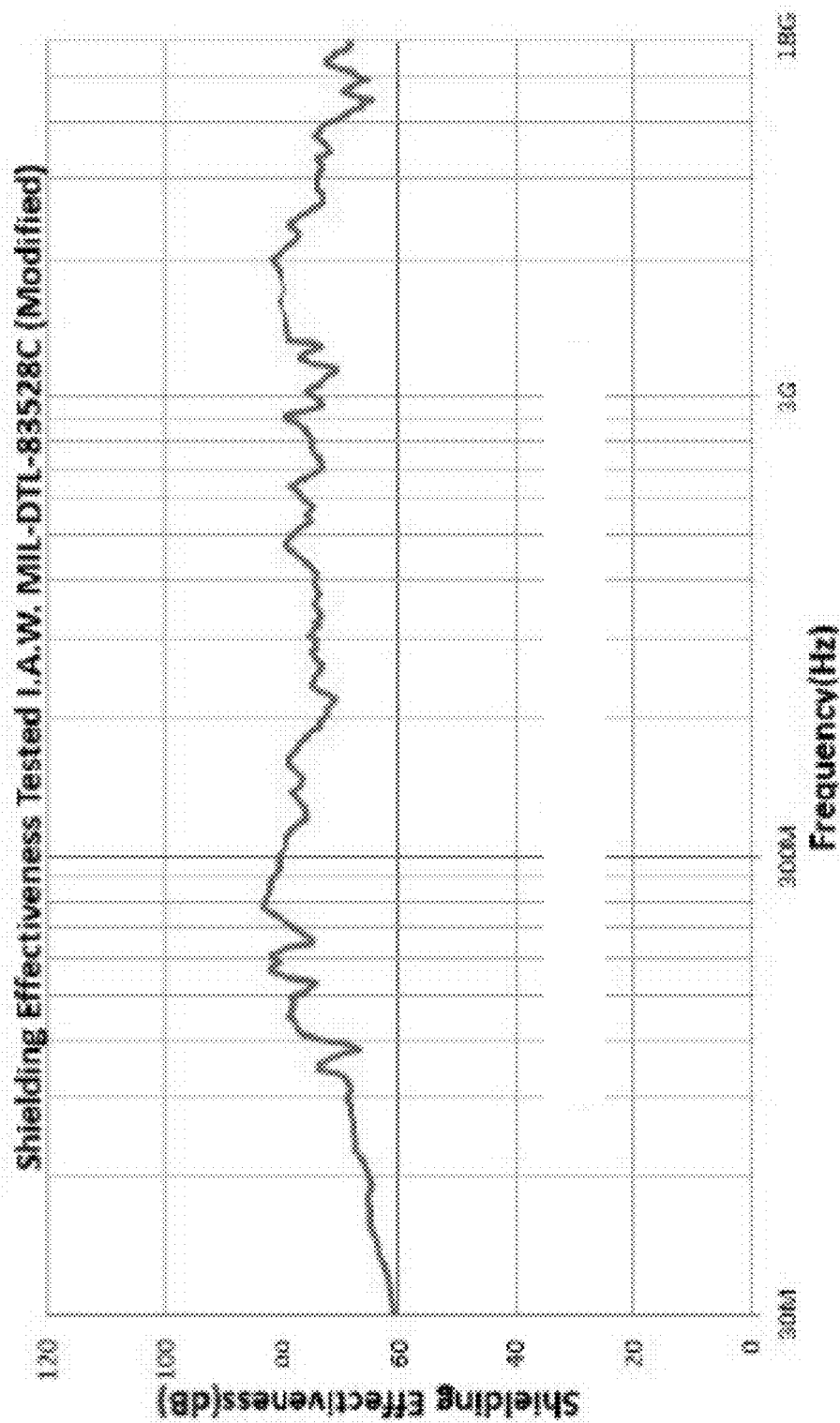
FIG. 7 is a line graph of shielding effectiveness in decibels (dB) tested according to I.A.W MIL-DTL-83528C (modified) versus frequency from 30 megahertz (MHz) to 18 gigahertz (GHz) at a 50% compression ratio for an electrically and thermally conductive gasket according to the exemplary embodiment shown in FIG. 4 without conductive PSA along the bottom of the gasket.
Figure 8:
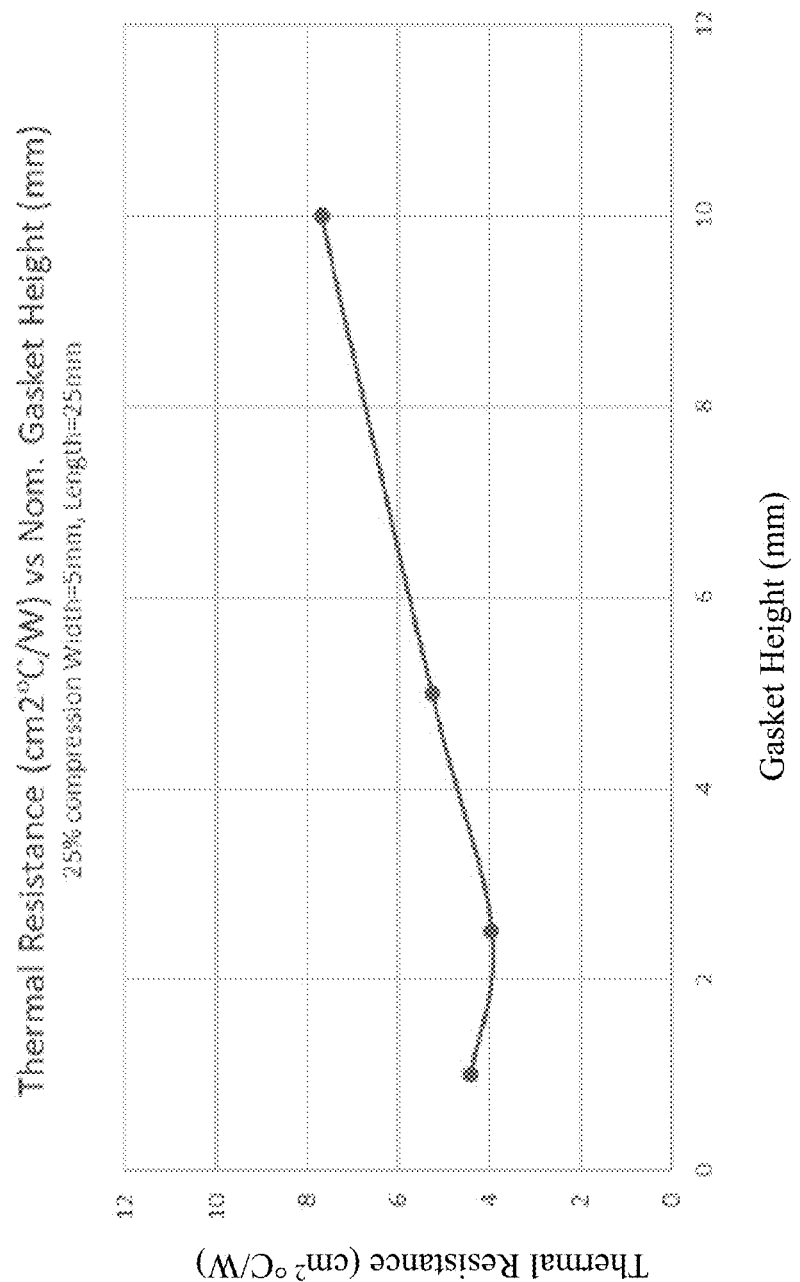
FIG. 8 is a line graph of thermal resistance in square centimeter degrees Celsius per Watt ($cm^{2\circ}$ C./W) versus gasket height in millimeters (mm) at a 25% compression ratio, gasket width of 5 mm, and gasket length of 25 mm for an electrically and thermally conductive gasket according to the exemplary embodiment shown in FIG. 4 without conductive PSA along the bottom of the gasket.
Figure 9:
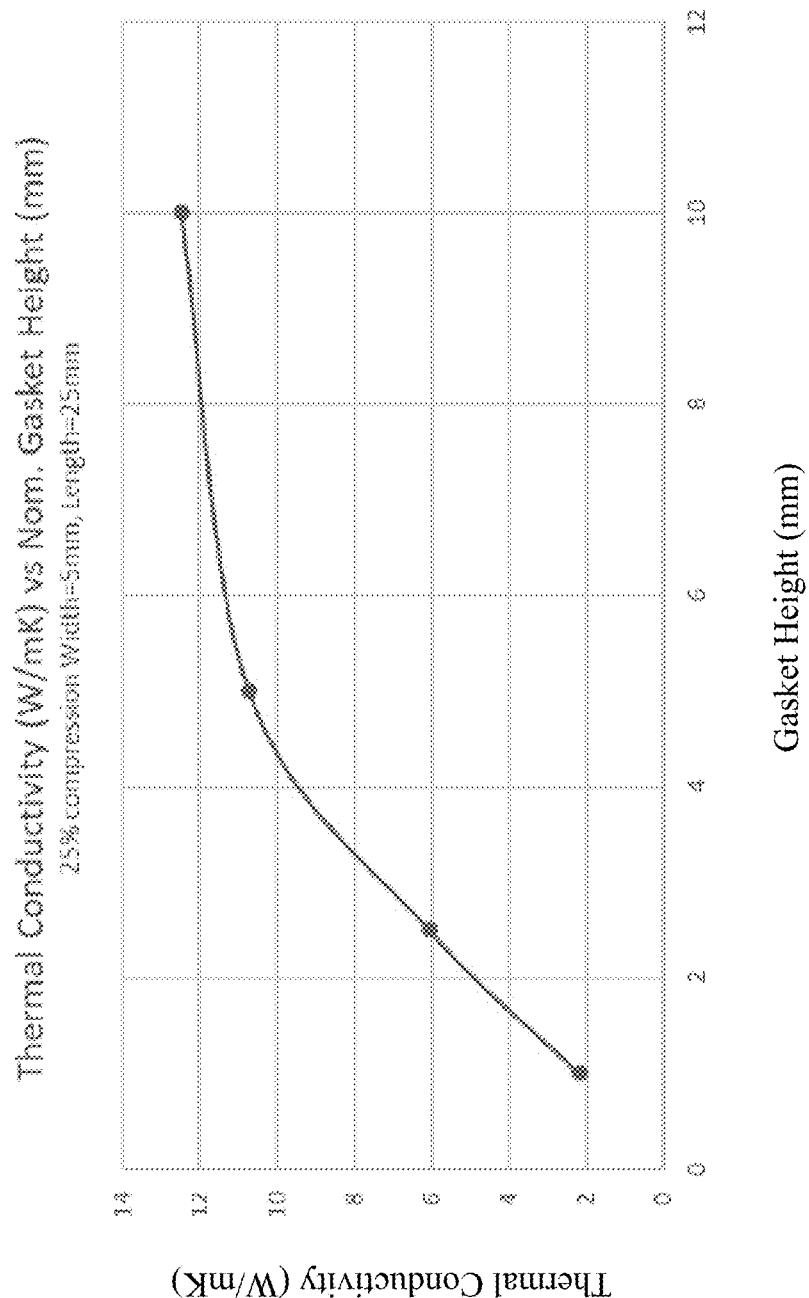
FIG. 9 is a line graph of thermal conductivity in Watts per meter Kelvin (W/mK) versus gasket height in millimeters (mm) at a 25% compression rate, gasket width of 5 mm, and gasket length of 25 mm for an electrically and thermally conductive gasket according to the exemplary embodiment shown in FIG. 4 without conductive PSA along the bottom of the gasket.

Exemplary embodiments of electrically and thermally conductive gaskets are disclosed that are compressible and/or positionable between surfaces of components in devices. Exemplary electrically and thermally conductive gaskets include a resilient core (e.g., foam, etc.), a heat spreader (e.g., graphite, etc.) disposed along at least a portion of the resilient core's perimeter, and an electrically conductive layer (e.g., copper, etc.) disposed along and/or covering at least a portion of the heat spreader. Gaskets disclosed herein may have enhanced electrical and thermal characteristics (e.g., FIGS. 5-11, etc.) as compared to conventional gaskets. For example, an exemplary embodiment of a gasket disclosed herein may be configured to have:

- a maximum compression ratio within a range from about 40% to about 70% as shown in FIGS. 5 and 11; and/or
- a Z-axis electrical resistance of less than 0.04 ohms for a compression ratio within a range from about 0% compression to about 70% compression as shown in FIG. 6; and/or
- a shielding effective (according to I.A.W MIL-DTL-83528C (modified)) greater than 60 decibels for frequencies within a range from 30 megahertz (MHz) to 18 gigahertz at a 50% compression ratio as shown in FIG. 7; and/or
- a thermal resistance of less than 8 $cm^{2\circ}$ C./W at a 25% compression ratio, gasket width of 5 mm, gasket length 25 mm, and gasket heights of 10 mm or less as shown in FIG. 8; and/or
- a thermal conductivity of greater than 2 W/mK at a 25% compression ratio, gasket width of 5 mm, gasket length 25 mm, and gasket heights of 1 mm or more as shown in FIG. 9; and/or
- a thermal resistance of less than 8 $cm^{2\circ}$ C./W at a compression ratio within a range from about 15% to 75% for gasket heights of 10 millimeters or less as shown in FIG. 10; and/or
- a Z-axis electrical resistance of less than 0.01 ohms for a compression ratio within a range from about 5% compression to about 70% compression for gasket heights of 10 millimeters or less as shown in FIG. 11.

Additionally, gaskets disclosed herein may have good compression and resiliency. For example, a gasket may be compressed to about 15%-60% of its original (uncompressed) state (e.g., height in the Z-direction). When compressed less than 25% of its original (uncompressed) state, the gasket may recover to 90% to 100% of its original (uncompressed) state.

Figure 1:
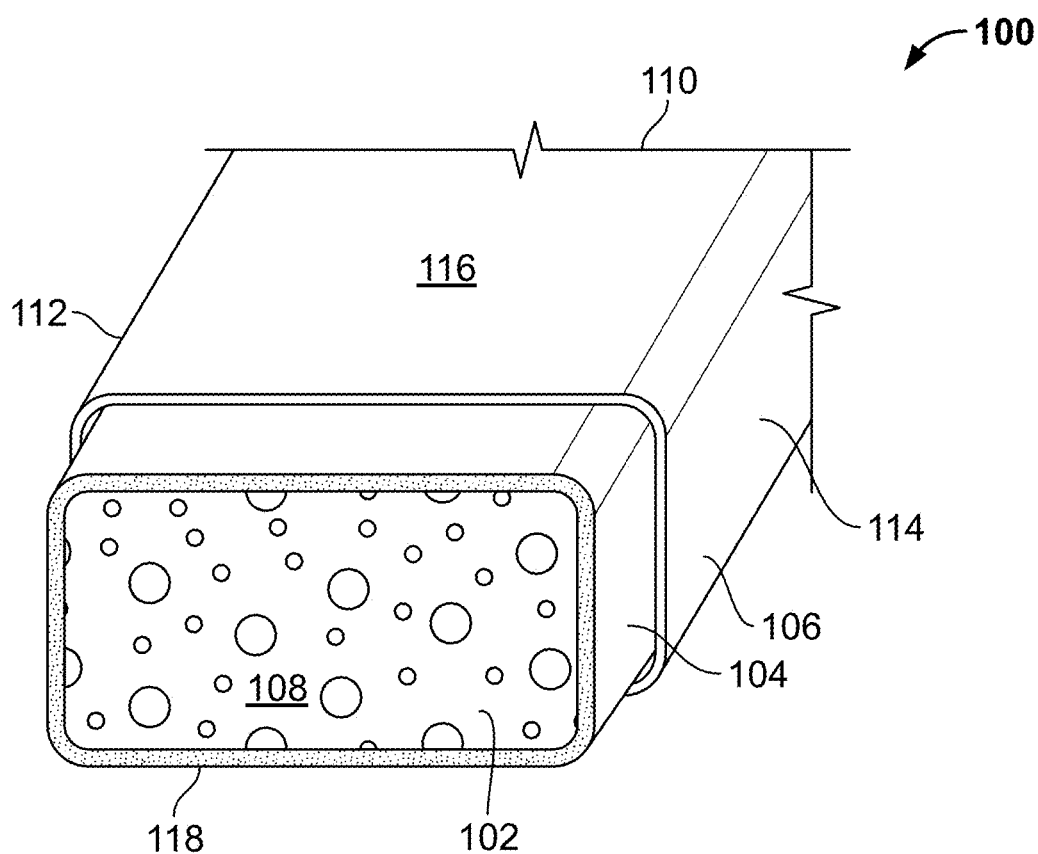
FIG. 1 is a perspective view of an electrically and thermally conductive gasket including a resilient core, a heat spreader wrapped around the resilient core, and electrically conductive layer wrapped around the heat spreader according to an exemplary embodiment of the present disclosure.
Figure 2:
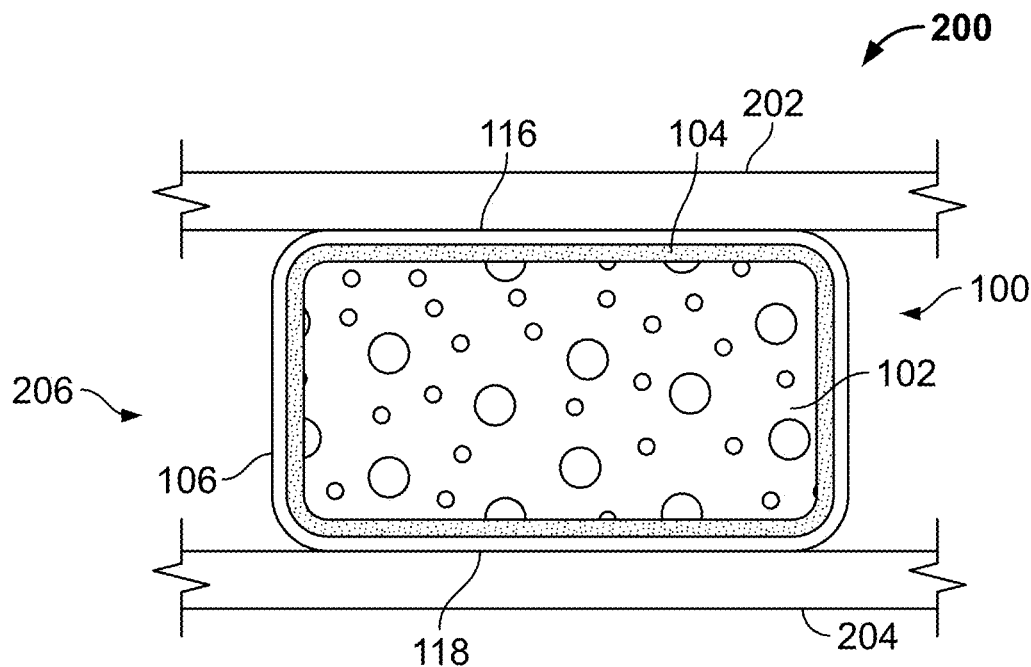
FIG. 2 is a front view of a device including the gasket shown in FIG. 1 positioned between two surfaces thereby forming an electrically conductive path and a thermally conductive path between the surfaces according to an exemplary embodiment.

FIGS. 1 and 2 illustrate an electrically and thermally conductive gasket 100 according to an exemplary embodiment of the present disclosure. The electrically and thermally conductive gasket 100 includes a resilient core 102, a heat spreader 104 disposed along the resilient core 102. An electrically conductive layer 106 is disposed along and covers at least a portion of the heat spreader 104 such that the portion of the heat spreader 104 is between the resilient core 102 and the electrically conductive layer 106.

As shown in FIG. 1, the gasket 100 has a rectangular shape. For example, the gasket 100 includes six sides 108, 110, 112, 114, 116, 118 for defining a perimeter of the gasket 100. In the exemplary embodiment of FIG. 1, the sides 108, 110 form opposing end portions of the gasket 100, the sides 112, 114 form opposing side portions, and the sides 116, 118 form opposing top and bottom portions. Although FIG. 1 illustrates the gasket 100 as being rectangular and including six sides, it should be apparent to those skilled in the art that other suitable shaped gaskets including more or less sides may be employed without departing from the scope of the present disclosure, as further explained below.

The gasket 100 may be compressed between one or more surfaces of components in a device. For example, the core 102, the heat spreader 104, and the electrically conductive layer 106 may be compressed when a force is applied to the gasket 100. Additionally, the core 102 may be generally resilient in nature thereby urging the core 102 to return to its original uncompressed or steady state. This resilient nature of the core 102 may force the electrically conductive layer 106 to press against and contact component surfaces when the gasket 100 is positioned between the component surfaces.

The gasket 100 may form an electrically conductive path and a thermally conductive path when the gasket 100 is positioned between the component surfaces. For example, FIG. 2 illustrates a device 200 including two components 202, 204 spaced apart by a gap 206. The gasket 100 is positioned in the gap 206 to form an electrically conductive path and a thermally conductive path between the components 202, 204.

As shown in FIG. 2, the opposing sides 116, 118 (e.g., the opposing top and bottom portions) of the gasket 100 contact the components 202, 204, respectively. In such examples, an electrically conductive path may be formed via the electrically conductive layer 106 contacting corresponding portions of the components 202, 204. For example, the resilient core 102 urges the electrically conductive layer 106 to contact an electrically conductive portion of the component 202 and an electrically conductive portion of the component 204. This creates a path for electrical current to flow from one component (e.g., the component 202) through the electrically conductive layer 106 and to the other component (e.g., the component 204). As a result, the gasket 100 may assist in shielding (e.g., electromagnetic interference (EMI) shielding including radio frequency shielding) and/or electrical grounding applications.

Additionally, the gasket 100 may form a thermally conductive path between the components 202, 204 via the heat spreader 104 and the electrically conductive layer 106, which is in thermal communication with corresponding portions of the components 202, 204. Accordingly, a thermal path is formed from one component (e.g., the component 202) through the electrically conductive layer 106 and heat spreader 104 to the other component (e.g., the component 204).

Referring back to FIG. 1, the heat spreader 104 may cover some or all portions of the gasket 100. In the exemplary embodiment of FIG. 1, the heat spreader 104 covers the sides 112, 114, 116, 118, but does not cover the ends 108, 110 of the gasket 100. In such examples, the heat spreader 104 extends completely around the resilient core 102 between the sides 108, 110 of the gasket 100. The electrically conductive layer 106 also does not cover the ends 108, 110 of the gasket 100. The resilient core 102 may be exposed at the ends 108, 110 as shown in FIG. 1. In other exemplary embodiments, the heat spreader 104 and/or electrically conductive layer 106 may also cover the end 108, 110 of the gasket 100.

The electrically conductive layer 106 may cover some or all portions of the heat spreader 104. Likewise, the heat spreader 104 may cover some or all portions of the resilient core 102. For example, FIGS. 1 and 2 show the heat spreader 104 wrapped around each of the top, bottom, and sides of the resilient core 102. Stated differently, the heat spreader 104 is wrapped around an entire perimeter of the resilient core 102 defined by the core's top, bottom and sides. The electrically conductive layer 106 may also be wrapped around each of the top, bottom, and sides of the heat spreader 104. Stated differently, the electrically conductive layer 106 may be wrapped around an entire perimeter of the heat spreader 104 defined by the heat spreader's top, bottom and sides.

Figure 3:
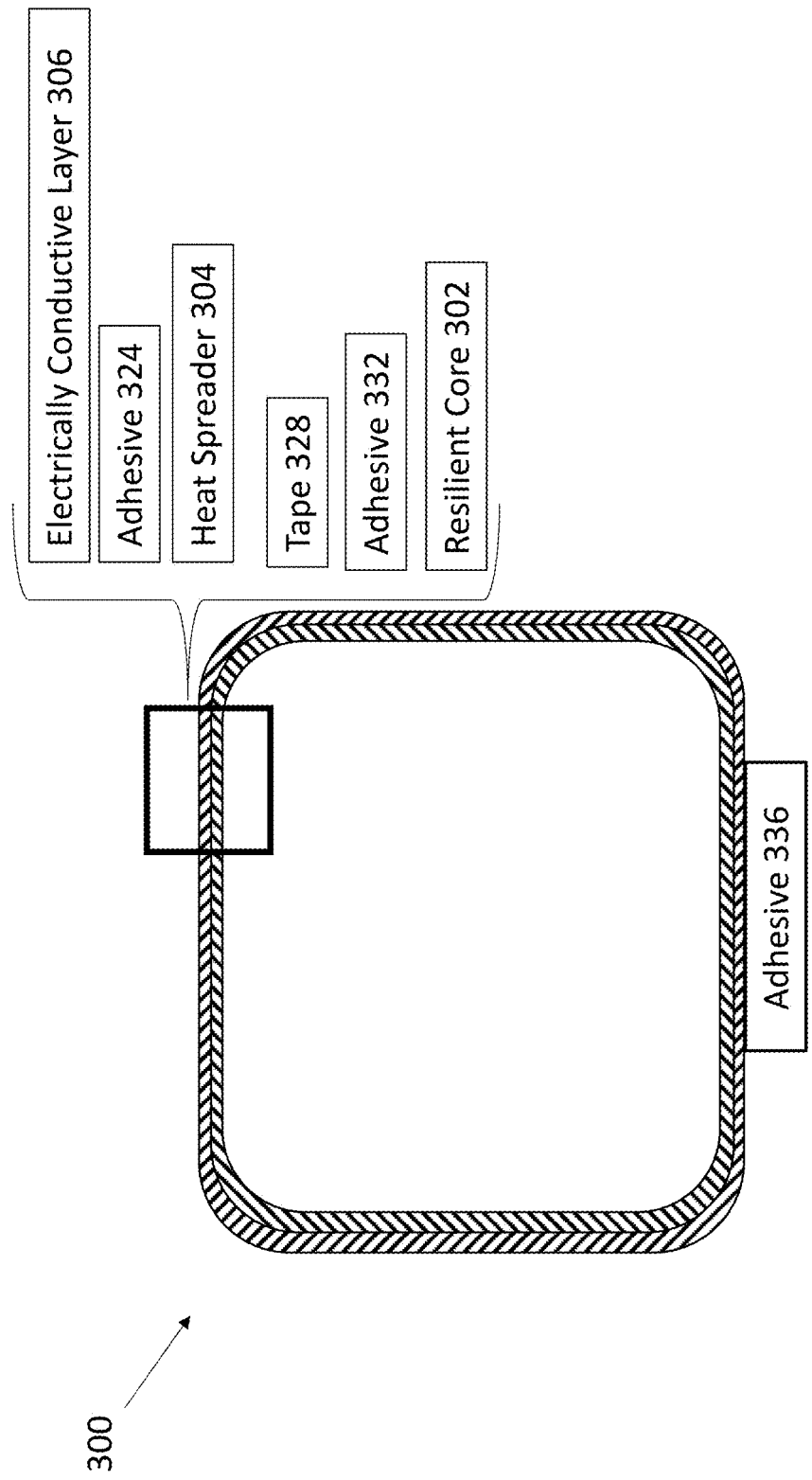
FIG. 3 is a front view of an electrically and thermally conductive gasket according to an exemplary embodiment.

FIG. 3 illustrates an electrically and thermally conductive gasket 300 according to an exemplary embodiment of the present disclosure. The gasket 300 includes a resilient core 302, a heat spreader 304, and an electrically conductive layer 306. The heat spreader 304 is disposed around a perimeter of the resilient core 302 defined by the four sides of the resilient core 302. The electrically conductive layer 306 is disposed around a perimeter defined by the four sides of the heat spreader 304, such that the heat spreader 304 is covered (e.g., protected, etc.) by the electrically conductive layer 306.

In this exemplary embodiment, the heat spreader 304 and electrically conductive layer 306 may be laminated together, and then wrapped around the resilient core 302. For example, the gasket 300 may include a laminate that comprises the heat spreader 304 (e.g., a flexible sheet of natural graphite and/or synthetic graphite, etc.) laminated with the electrically conductive layer 306 (e.g., copper foil, other metal foil, metallized plastic, electrically-conductive fabric, etc.). The laminate may include an adhesive 324 (e.g., pressure sensitive adhesive, etc.) between and adhesively bonding the heat spreader 304 and the electrically conductive layer 306. The heat spreader 304, adhesive 324, and electrically conductive layer 306 may be collectively wrapped together in the form of the laminate around the perimeter of the resilient core 302 (e.g., silicone foam, polyurethane foam, other foam, other resilient material, etc.) defined by the plurality of sides of the resilient core 302.

As shown in FIG. 3, the gasket 300 may further include a tape 328 (e.g., PET film and adhesive, etc.), an adhesive 332, and an adhesive 336 (e.g., electrically conductive and thermally conductive pressure sensitive adhesive, etc.). The tape 328 may be disposed along the bottom of the heat spreader 304, e.g., to provide mechanical strength, abrasion resistance, and/or protection of the heat spreader 304 (e.g., inhibit graphite from flaking or breaking off, etc.). The adhesive 332 may be disposed between the tape 328 and the resilient core 302, e.g., for bonding the laminate to the resilient core 302.

The adhesive 336 is along an outer portion (e.g., bottom, etc.) of the gasket 100. The adhesive 336 may be used for adhesively bonding, electrically connecting, and thermally connecting the gasket 100 to a corresponding surface of a component (e.g., component 200 in FIG. 2, etc.).

FIG. 4 illustrates an electrically and thermally conductive gasket 400 according to an exemplary embodiment of the present disclosure. The gasket 400 includes a silicone foam core 402, a graphite layer 404, and a copper layer 406. The graphite layer 404 is disposed around a perimeter of the silicone foam core 402 defined by the four sides of the silicone foam core 402. The copper layer 406 is disposed around a perimeter defined by the four sides of the heat spreader 404, such that the graphite layer is covered (e.g., protected, etc.) by the copper layer 406.

In this exemplary embodiment, the graphite layer 404 and copper layer 406 may be laminated together, and then wrapped around the silicone foam core 402. For example, the gasket 400 may include a laminate that comprises the graphite layer 404 (e.g., a flexible sheet of natural graphite and/or synthetic graphite, etc.) laminated with the copper layer 406 (e.g., copper foil, etc.). The laminate may include an adhesive 424 (e.g., pressure sensitive adhesive, etc.) between and adhesively bonding the graphite layer 404 and the copper layer 406. The graphite layer 404, adhesive 424, and copper layer 406 may be collectively wrapped together in the form of the laminate around the perimeter of the silicone foam core 402 defined by the plurality of sides of the silicone foam core 402.

As shown in FIG. 4, the gasket 400 may further include a PET tape 428 (e.g., PET film and adhesive, etc.), an adhesive 432, and an electrically conductive and thermally conductive pressure sensitive adhesive (PSA) 436. The PET tape 428 may be disposed along the bottom of the graphite layer 404, e.g., to provide mechanical strength, abrasion resistance, and/or protection of the graphite layer 404 (e.g., inhibit graphite from flaking or breaking off, etc.). The adhesive 432 may be disposed between the PET tape 428 and the silicone foam core 402, e.g., for bonding the laminate to the silicone foam core 402.

The conductive PSA 436 is along an outer portion (e.g., bottom, etc.) of the gasket 100. The conductive PSA 436 may be used for adhesively bonding, electrically connecting, and thermally connecting the gasket 100 to a corresponding surface of a component (e.g., component 200 in FIG. 2, etc.).

By way of example only, the copper layer 406 may comprise a copper foil having a thickness within a range from about 2 microns to about 20 microns. For example, the copper foil may be about 5 microns thick.

The adhesive 424 may comprise a pressure sensitive adhesive layer having a thickness within a range from about 1 micron to about 10 microns. For example, the pressure sensitive adhesive layer may be about 3 microns thick.

The graphite layer 404 may comprise a synthetic graphite sheet having a thickness within a range from about 9 microns to about 100 microns. For example, the synthetic graphite sheet may be about 25 or 40 microns thick.

The PET tape 428 may comprise a PET film and adhesive having a thickness within a range from about 5 microns to about 50 microns. For example, the PET film and adhesive may be about 20 microns thick.

The adhesive 432 may comprise an adhesive layer having a thickness within a range from about 30 microns to about 120 microns. For example, the adhesive layer may be about 70 microns thick.

The foam core 402 may comprise a silicone foam core (e.g., for 125° C., etc.), polyurethane foam, other foam, other resilient material, etc. For example, the foam core 402 may comprise a silicone or polyurethane foam having a thickness within a range from about 0.5 mm to about 60 mm.

The conductive PSA 436 may comprise an acrylic or silicone PSA with thermal and electrical conductivity. The conductive PSA 436 may have a thickness within range from about 0.005 mm to about 0.15 mm.

In exemplary embodiments disclosed herein, the heat spreader may be wrapped (broadly, disposed) around all or portions of the resilient core. Then, the electrically conductive layer may be wrapped (broadly, disposed) around all or portions of the heat spreader. Alternatively, a laminate may be formed of at least a heat spreader and an electrically conductive layer, and then wrapped around a resilient core.

In exemplary embodiments disclosed herein, the resilient core, the heat spreader, and the electrically conductive layer combined have no more than a maximum of 900 parts per million chlorine, no more than a maximum of 900 parts per million bromine, and no more than a maximum of 1,500 parts per million total halogens such that the gasket is defined as halogen free. In exemplary embodiments disclosed herein, the gasket has a flame rating of V-0 under Underwriter's Laboratories (UL) Standard No. 94.

Any one of the gaskets disclosed herein may be positioned between components in a device to thereby define an electrically conductive path and a thermally conductive path between the components. For example, any one of the gaskets may be positioned between the components 202, 204 of the device 200 of FIG. 2 and/or between other components in the device 200 and/or another suitable device. In the exemplary embodiment of FIG. 2, the components 202, 204 extend in substantially parallel planes and define the gap 206 therebetween. The gap 206 may have any suitable width. For example, the gap 206 may be about 3 millimeters wide. Alternatively, the gap 206 may range from 1 to 2.5 millimeters wide, 3.5 to 7 millimeters wide, less than 1 millimeters wide, etc. The gasket 100 may have a similar width between the opposing sides 116, 118 when the gasket 100 (e.g., in a compressed state or uncompressed state) is between the components 202, 204.

Due to the substantially parallel planes, gaskets having opposing parallel extending sides may be most suitable for placing between the components 202, 204. Such gaskets may include generally cuboidal-shaped gaskets or another suitable shaped-gasket such as cube-shaped gaskets, parallelepiped-shaped gaskets, cylinder-shaped gaskets, frustum-shaped gaskets, etc. In other exemplary embodiments, the gaskets may be another suitable shape depending on, e.g., the arrangement of the components in the device.

The devices disclosed herein may include electronic devices having one or more heat sources, shielding structures or components, heat removal/dissipation structures or components, and/or other suitable features. The shielding structures or components may include, e.g., board level EMI shielding structures or components, etc. The heat removal/dissipation structures or components may include, e.g., a heat spreader, a heat sink, a heat pipe, a device exterior case or housing, etc. Generally, a heat source may include any component or device that has a higher temperature than the gasket or otherwise provides or transfers heat to the gasket regardless of whether the heat is generated by the heat source or merely transferred through or via the heat source. For example, a heat source may include one or more heat generating components or devices (e.g., a CPU, die with underfill, semiconductor device, flip chip device, graphics processing unit (GPU), digital signal processor (DSP), multiprocessor system, integrated circuit, multi-core processor, etc.), a substrate (e.g., a circuit board such as a printed circuit board, etc.), etc. Accordingly, aspects of the present disclosure should not be limited to any particular use with any single type of heat source, electronic device, heat removal/dissipation structure, etc.

The components disclosed herein may include any suitable components in the device. For example, the components may include heat sources, shielding structures or components, heat removal/dissipation structures or components, etc. as explained above.

The heat spreaders disclosed herein may include graphite (e.g., natural graphite, synthetic graphite, combinations thereof, etc.), metallic (e.g., copper, aluminum, gold, etc. and/or alloys thereof) component or structure and/or another suitable heat-spreading component or structure. The metallic component or structure may be made of copper, aluminum, gold, etc. and/or alloys thereof. The graphite may be formed one or more graphite sheets such as one or more Tgon™ 800 series natural graphite sheets (e.g., Tgon™ 805, 810, 820, etc.), Tgon™ 8000 series graphite sheets, Tgon™ 9000 series synthetic graphite sheets (e.g., Tgon™ 9017, 9025, 9040, 9070, 9100, etc.), other graphite sheet materials, etc. In other embodiments, the metallic component or structure may include a metal foil, a multi-laminate structure, etc. The multi-laminate structure may include a multi-laminate structure of metal and plastic.

In exemplary embodiments, the heat spreader (e.g., 104 (FIG. 1), 304 (FIG. 3), 404 (FIG. 4), etc.) may comprise a flexible sheet of natural and/or synthetic graphite. For example, the graphite may comprise a graphite sheet (e.g., Tgon™ 9000 series graphite sheets, etc.) from Laird Technologies, such as a Tgon™ 9017, Tgon™ 9025, Tgon™ 9040, Tgon™ 9070, and/or Tgon™ 9100 synthetic graphite sheet. Table 1 below includes additional details about Tgon™ 9000 series synthetic graphite from Laird Technologies.

The graphite sheet(s) may include one or more Tgon™ 9000 series graphite sheets that comprise synthetic graphite thermal interface materials having a carbon in-plane monocrystal structure and that are ultra-thin, light-weight, flexible and offer excellent in-plane thermal conductivity. Tgon™ 9000 series graphite sheets are useful for a variety of heat spreading applications where in-plane thermal conductivity dominates and in limited spaces. Tgon™ 9000 series graphite sheets may have a thermal conductivity from about 500 W/mK to about 1900 W/mK, may help reduce hot spots and protect sensitive areas, may enable slim device designs due to the ultra-thin sheet thickness of about 17 micrometers to about 100 micrometers, may be light weight (e.g., density from about 2.05 to 2.25 g/cm$^3$ for a thickness of 17 micrometers or 25 micrometers, etc.), may be flexible and able to withstand more than 10,000 times bending with radius of 5 millimeters.

irregular spheroids, strands, flakes, powder, and/or a combination of any or all of these shapes. In addition, exemplary embodiments may also include different grades (e.g., different sizes, different purities, different shapes, etc.) of the same (or different) fillers.

The electrically conductive layers disclosed herein may include one or more electrically conductive foils (e.g., a copper foil, other metal foil, etc.), a metallized and/or plated fabrics (e.g., nickel-copper plated nylon, etc.), etc. The electrically conductive layers may have metal plating or

TABLE 1

| Product Name | Test Method | Tgon 9017 | Tgon 9025 | Tgon 9040 | Tgon 9070 | Tgon 9100 |
|---|---|---|---|---|---|---|
| Thickness (mm) | ASTM D374 | 0.017 +/− 0.005 | 0.025 +/− 0.005 | 0.04 +/− 0.005 | 0.07 +/− 0.01 | 0.1 +/− 0.01 |
| Thermal conductivity (W/mk)   X, Y direction | ASTM E1461 | 1650~1900 | 1500~1700 | 1150~1400 | 700~1000 | 500~700 |
| Z direction | | 15 | 15 | 15 | 15 | 15 |
| Thermal diffusivity (cm$^2$/s) | ASTM E1461 | 9 | 9 | 8 | 7 | 7 |
| Density (g/cm$^3$) | ASTM D792 | 2.05~2.25 | 2.05~2.25 | 1.65~1.85 | 1.0~1.3 | 0.7~1.0 |
| Specific heat (50° C.)(J/gK) | ASTM E1269 | 0.85 | 0.85 | 0.85 | 0.85 | 0.85 |
| Heat resistance (° C.) | Over 100 hours of testing | 400 | 400 | 400 | 400 | 400 |
| Extensional strength (MPa)   X, Y direction | ASTM F152 | 39 | 28 | 23 | 20 | 19.2 |
| Z direction | | 0.1 | 0.4 | 0.4 | 0.4 | 0.65 |
| Bending test (times) (RS/180°) | ASTM D2176 | 10,000 or more | 10,000 or more | 10,000 or more | 10,000 or more | 10,000 or more |
| Electric conductivity (S/cm) | ASTM E1269 | 20000 | 20000 | 20000 | 96000 | 96000 |

The resilient cores disclosed herein may include any suitable material. For example, the resilient cores may be formed of a foam material (e.g., a silicone foam material, a polymeric elastomer material, a cellular polymeric foam such as an open cell foam, a closed cell foam, a neoprene foam, a urethane foam (e.g., a polyester foam, a polyether foam, a combination thereof, etc.), a polyurethane foam, etc.), a silicone rubber material, etc. In some exemplary embodiments, the resilient cores may be extruded.

The resilient cores may be electrically conductive and/or thermally conductive. For example, the resilient cores may include electrically conductive particles (e.g., fillers, etc.) dispersed therein. In an exemplary embodiment, one or more additives or fillers may be added to the resilient material used for the resilient core. A wide variety of additives or fillers may be incorporated into the resilient core material (e.g., silicone foam, polyurethane foam, etc.) to tailor, modify, and/or functionally tune property(ies) of the resilient core. For example, the fillers may include functional nanoparticles, electrically-conductive fillers, thermally-conductive fillers, EMI or microwave absorbing fillers, magnetic fillers, dielectric fillers, coated fillers, combinations thereof, etc. Example fillers include carbon black, boron nitride, nickel cobalt, carbonyl iron, iron silicide, iron particles, iron-chrome compounds, silver, an alloy containing 85% iron, 9.5% silicon and 5.5% aluminum, an alloy containing about 20% iron and 80% nickel, ferrites, magnetic alloys, magnetic powders, magnetic flakes, magnetic particles, nickel-based alloys and powders, chrome alloys, aluminum oxide, copper, zinc oxide, alumina, aluminum, graphite, ceramics, silicon carbide, manganese zinc, fiberglass, combinations thereof, etc. The fillers may comprise one or more of granules, spheroids, microspheres, ellipsoids, electrically-conductive ink or paste (e.g., silver ink or paste, etc.) applied (e.g., plated, printed, etc.) onto either or both surfaces of the films. For example, the electrically conductive layers may include metal-plated polyimide fabrics, metallized-plated polyimide fabrics, poly-foil (e.g., metal foil laminated to polyester or PET, polypropylene (PP), polyethylene (PE), other polymer, etc.), etc. In some examples, the electrically conductive layers may comprise Mylar® polyester films, other polyester films, polyimide (PI) films, PET films, polyethylene naphthalate (PEN) films, etc.

In some examples, the heat spreaders, the electrically conductive layers and/or the resilient cores may be adhered together. In such examples, the gaskets may include an adhesive to bond at least two of these layers together. In some embodiments, the adhesive may be an electrically conductive adhesive such as a silicone-based conductive adhesive (e.g., a silicone PSA, etc.). In other embodiments, the adhesive may include a double-sided tape (e.g., one or more strips) with or without a metallized (e.g., nickel, copper, etc.) film. In still other embodiments, the adhesive may include adhesives such as solvent-based polyester adhesives, epoxy-based adhesives, hot melt adhesives, combinations thereof, etc.

Disclosed herein are exemplary embodiments copper-over-graphite-over-foam (COGOF) electrically and thermally conductive gaskets that are configured to provide thermal transfer performance in the form of a wrapped compressible foam gasket and that include an outside copper foil or wrap for electrical conductivity. Such exemplary embodiments may be configured to combine the thermal transfer performance associated with a graphite sheet or wrap and the repeatable compression and rebound of a foam core. In exemplary embodiments, the electrically and thermally conductive gasket may include a silicone foam core for lower compression force and UL V0 flammability rating.

Exemplary embodiments disclosed herein (e.g., gasket 100 (FIG. 1, gasket 300 (FIG. 3), gasket 400 (FIG. 4), etc.) may include or provide one or more (but not necessarily any or all) of the advantages or features listed below.

Electrical conductivity for EMI grounding
High deflection
Repeatable compression and rebound cycles
Good thermal conductivity between interfaces
Lightweight
Low force thermal interface
Abrasion resistant exterior
Ease of manufacturing for high volume
Meets environmental standards requirements
UL V0 flammability rating
Provides compressible thermal interface for sliding connections. Ideal for insertion applications
Ability to combine EMI shielding and thermal management into one part
Ensures thermal interface contact in high movement locations that would separate a conventional thermal putty, gel, or grease
Offers lower force than traditional thermal interface pads for pressure sensitive applications
Improved reliability performance of electronics
Environmentally friendly solution meets including RoHS and REACH
Compression Set less than 2% at 125° C. at 7 days
Shelf Life of 12 months at 23° C. and 60% Relative Humidity Exemplary embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that exemplary embodiments may be embodied in many different forms, and that neither should be construed to limit the scope of the disclosure. In some exemplary embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1 - 2, 2-10, 2-8, 2-3, 3-10, and 3-9.

The terminology used herein is for the purpose of describing particular exemplary embodiments only and is not intended to be limiting. For example, when permissive phrases, such as "may comprise", "may include", and the like, are used herein, at least one embodiment comprises or includes such feature(s). As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances. Whether or not modified by the term "about", the claims include equivalents to the quantities.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the exemplary embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An electrically and thermally conductive gasket comprising:
   a resilient core comprising foam and including a plurality of sides;
   a heat spreader comprising a graphite sheet wrapped around and covering all of the plurality of sides of the resilient core;
   an electrically conductive layer disposed over and covering all of a plurality of sides of the graphite sheet without an intervening film between the electrically conductive layer and the graphite sheet, such that the electrically conductive layer inhibits graphite from flaking or breaking off from the portion of the graphite sheet covered by the electrically conductive layer;
   an outer adhesive between and adhesively bonding the electrically conductive layer directly to the graphite sheet;
   a tape is along the heat spreader;
   an inner adhesive between and adhesively bonding the tape and the resilient core;
   an electrically conductive and thermally conductive pressure sensitive adhesive is along an outer portion of the gasket for adhesively bonding the gasket to the second surface;
   wherein the electrically conductive layer is configured to provide mechanical strength, abrasion resistance, and protection for the portion of the graphite sheet covered by the electrically conductive layer, and to provide electrical conductivity and additional thermal transfer for the gasket;
   whereby the gasket is positionable and compressible between first and second surfaces to thereby define an electrically conductive path and a thermally conductive path between the first and second surfaces;
   wherein the gasket is configured to have:
      a maximum compression ratio within a range from about 40% to about 70%;
      a shielding effectiveness greater than 60 decibels for frequencies within a range from 30 megahertz to 18 gigahertz at a 50% compression ratio;
      a thermal conductivity greater than 2 W/mK at a 25% compression ratio and a gasket height of 1 millimeter or more;
      a Z-axis electrical resistance of less than 0.04 ohms for a compression ratio within a range from about 0% compression to about 70% compression;
      a Z-axis electrical resistance of less than 0.01 ohms for a compression ratio within a range from about 5% compression to about 70% compression for a gasket height of 10 millimeters or less;
      a thermal resistance of less than 8 $cm^{2\circ}$ C./W at a 25% compression ratio and a gasket height of 10 millimeters or less; and
      a thermal resistance of less than 8 $cm^{2\circ}$ C./W at a compression ratio within a range from about 15% to 75% for a gasket height of 10 millimeters or less;
   wherein the gasket is configured to be compressible to about 15% to 60% of its original (uncompressed) state, such that when the gasket is compressed to less than 25% of its original (uncompressed) state, the gasket recovers to 90% to 100% of its original (uncompressed) state;
   wherein the resilient core, the heat spreader, and the electrically conductive layer combined have no more than a maximum of 900 parts per million chlorine, no more than a maximum of 900 parts per million bromine, and no more than a maximum of 1,500 parts per million total halogens such that the gasket is defined as halogen free; and
   wherein the gasket has a flame rating of V-0 under Underwriter's Laboratories (UL) Standard No. 94.

2. The electrically and thermally conductive gasket of claim 1, wherein:
   the graphite sheet comprises a flexible graphite sheet wrapped around all of the plurality of sides of the resilient core;
   the electrically conductive layer comprises a copper foil wrapped around and directly against all of a plurality of sides of the flexible graphite sheet whereby the copper foil covers the flexible graphite sheet without an intervening film between the copper foil and the flexible graphite sheet, such that the copper foil inhibits graphite from flaking or breaking off from the portion of the flexible graphite sheet covered by the copper foil;
   the copper foil has a higher thermal conductivity than the flexible graphite sheet in a through-thickness direction; and
   the flexible graphite sheet has a higher in-plane thermal conductivity than the copper foil.

3. The electrically and thermally conductive gasket of claim 1, wherein:
   the electrically conductive layer comprises a copper foil disposed around and directly against all of the plurality of sides of the graphite sheet without an intervening film between the copper foil and the graphite sheet, such that the copper foil inhibits graphite from flaking or breaking off from the portion of the graphite sheet covered by the copper foil;
   the copper foil has a higher thermal conductivity than the graphite sheet in a through-thickness direction; and
   the graphite sheet has a higher in-plane thermal conductivity than the copper foil.

4. The electrically and thermally conductive gasket of claim 1, wherein the electrically conductive layer comprises copper.

5. The electrically and thermally conductive gasket of claim 1, wherein the gasket comprises a laminate that includes the heat spreader laminated together with the electrically conductive layer, and wherein the laminate including the heat spreader and electrically conductive layer laminated together are collectively wrapped around all of the plurality of sides of the resilient core.

6. The electrically and thermally conductive gasket of claim 1, wherein:
the electrically conductive layer comprises a copper foil; and
the gasket comprises a laminate that includes the graphite sheet laminated together with the copper foil, the laminate including the graphite sheet and the copper foil laminated together are collectively wrapped around all of the plurality of sides of the resilient core.

7. The electrically and thermally conductive gasket of claim 6, wherein:
the laminate includes an adhesive between and adhesively bonding the heat spreader and the electrically conductive layer; and
the gasket includes an adhesive between and bonding the laminate and the resilient core.

8. The electrically and thermally conductive gasket of claim 1, wherein:
the outer adhesive is a pressure sensitive adhesive that adhesively bonds the electrically conductive layer directly to the graphite sheet;
the tape is a polyethylene terephthalate film and adhesive; and
the inner adhesive adhesively bonds the polyethylene terephthalate film and the resilient core.

9. The electrically and thermally conductive gasket of claim 1, wherein the gasket includes an electrically conductive and thermally conductive adhesive along an outer portion of the gasket for adhesively bonding the gasket to the second surface.

10. The electrically and thermally conductive gasket of claim 1, wherein:
the graphite sheet comprises a natural graphite sheet or a synthetic graphite sheet;
the electrically conductive layer comprises a copper foil wrapped around and directly against all of a plurality of sides of the natural graphite sheet or a synthetic graphite sheet without an intervening film between the copper foil and the natural graphite sheet or a synthetic graphite sheet, such that the copper foil inhibits graphite from flaking or breaking off from the portion of the natural graphite sheet or the synthetic graphite sheet covered by the copper foil;
the resilient core comprises silicone foam or polyurethane foam;
the copper foil has a higher thermal conductivity than the natural graphite sheet or the synthetic graphite sheet in a through-thickness direction; and
the natural graphite sheet or the synthetic graphite sheet has a higher in-plane thermal conductivity than the copper foil.

11. The electrically and thermally conductive gasket of claim 1, wherein:
the graphite sheet is disposed around and directly against all of the plurality of sides of the resilient core including ends of the resilient core; and
the electrically conductive layer is disposed around and directly against all of the plurality of sides of the graphite sheet.

12. The electrically and thermally conductive gasket of claim 1, wherein:
the electrically conductive layer has a higher electrical conductivity than the heat spreader;
the electrically conductive layer has a higher thermal conductivity than the heat spreader in a through-thickness direction; and
the heat spreader has a higher in-plane thermal conductivity than the electrically conductive layer.

13. An electrically and thermally conductive gasket comprising:
a resilient core comprising foam and including a plurality of sides;
a heat spreader comprising a graphite sheet wrapped around and covering all of the plurality of sides of the resilient core;
an electrically conductive layer disposed over and covering all of a plurality of sides of the graphite sheet without an intervening film between the electrically conductive layer and the graphite sheet, such that the electrically conductive layer inhibits graphite from flaking or breaking off from the portion of the graphite sheet covered by the electrically conductive layer;
an outer adhesive between and adhesively bonding the electrically conductive layer directly to the graphite sheet;
a tape is along the heat spreader;
an inner adhesive between and adhesively bonding the tape and the resilient core;
an electrically conductive and thermally conductive pressure sensitive adhesive is along an outer portion of the gasket for adhesively bonding the gasket to the second surface;
wherein the electrically conductive layer is configured to provide mechanical strength, abrasion resistance, and protection for the portion of the graphite sheet covered by the electrically conductive layer, and to provide electrical conductivity and additional thermal transfer for the gasket;
whereby the gasket is positionable and compressible between first and second surfaces to thereby define an electrically conductive path and a thermally conductive path between the first and second surfaces;
wherein:
the gasket is configured to have a maximum compression ratio within a range from about 40% to about 70%;
the gasket is configured to have a shielding effectiveness greater than 60 decibels for frequencies within a range from 30 megahertz to 18 gigahertz at a 50% compression ratio;
the gasket is configured to have a Z-axis electrical resistance of less than 0.04 ohms for a compression ratio within a range from about 0% compression to about 70% compression;
the resilient core, the heat spreader, and the electrically conductive layer combined have no more than a maximum of 900 parts per million chlorine, no more than a maximum of 900 parts per million bromine, and no more than a maximum of 1,500 parts per million total halogens such that the gasket is defined as halogen free;
the gasket has a flame rating of V-0 under Underwriter's Laboratories (UL) Standard No. 94; and
the gasket is configured to be compressible to about 15% to 60% of its original (uncompressed) state, such that when the gasket is compressed to less than 25% of its original (uncompressed) state, the gasket recovers to 90% to 100% of its original (uncompressed) state.

14. The electrically and thermally conductive gasket of claim 13, wherein:
the electrically conductive layer comprises a copper layer; and
the copper layer is disposed directly against the graphite sheet without an intervening film between the copper layer and the graphite sheet, such that the copper layer inhibits graphite from flaking or breaking off from the portion of the graphite sheet covered by the copper layer.

15. The electrically and thermally conductive gasket of claim 13, wherein the electrically conductive layer comprises an electrically-conductive fabric.

16. The electrically and thermally conductive gasket of claim 13, wherein the gasket is configured to have
a thermal conductivity greater than 2 W/mK at a 25% compression ratio and a gasket height of 1 millimeter or more.

17. The electrically and thermally conductive gasket of claim 13, wherein the gasket is configured to have:
a thermal resistance of less than 8 cm$^2$° C./W at a 25% compression ratio and a gasket height of 10 millimeters or less; and
a thermal resistance of less than 8 cm$^2$° C./W at a compression ratio within a range from about 15% to 75% for a gasket height of 10 millimeters or less.

18. The electrically and thermally conductive gasket of claim 13, wherein:
the outer adhesive is a pressure sensitive adhesive that adhesively bonds the electrically conductive layer directly to the graphite sheet;
the tape is a polyethylene terephthalate film and adhesive; and
the inner adhesive adhesively bonds the polyethylene terephthalate film and the resilient core.

19. The electrically and thermally conductive gasket of claim 1, wherein:
the electrically conductive layer comprises a copper foil disposed around and directly against all of the plurality of sides of the graphite sheet and covering ends of the gasket-without an intervening film between the copper foil and the graphite sheet, such that the copper foil inhibits graphite from flaking or breaking off from the portion of the graphite sheet covered by the copper foil;
the resilient core comprises silicone foam or polyurethane foam; and
an electrically conductive and thermally conductive adhesive is along an outer portion of the gasket for adhesively bonding the gasket to the second surface.

20. The electrically and thermally conductive gasket of claim 1, wherein:
the electrically conductive layer comprises a copper foil having a thickness within a range from about 2 microns to about 20 microns;
the graphite sheet comprises a synthetic graphite sheet having a thickness within a range from about 9 microns to about 100 microns; and
the resilient core comprises a foam core having a thickness within a range from about 0.5 mm to about 60 mm.

21. The electrically and thermally conductive gasket of claim 1, wherein the electrically conductive layer comprises an electrically-conductive fabric disposed over and covering all of the plurality of sides of the graphite sheet and covering ends of the gasket.

22. The electrically and thermally conductive gasket of claim 1, wherein the electrically conductive layer comprises:
a metallized and/or metal-plated fabric including nickel-copper plated nylon or metal-plated and/or metallized-plated polyimide fabric and that is disposed over and covering all of the plurality of sides of the graphite sheet and covering ends of the gasket; and/or
a poly-foil including a metal foil laminated to polymer and that is disposed over and covering all of the plurality of sides of the graphite sheet and covering ends of the gasket.

* * * * *